United States Patent [19]
Wang

[11] Patent Number: 5,782,403
[45] Date of Patent: Jul. 21, 1998

[54] ULTRASONIC CHIP REMOVAL METHOD AND APPARATUS

[75] Inventor: Li Wang, Manassas, Va.

[73] Assignee: International Business Machines Corporation, Armonk, N.Y.

[21] Appl. No.: 779,868

[22] Filed: Jan. 6, 1997

[51] Int. Cl.$^6$ .................................................. B23K 1/018
[52] U.S. Cl. ........................... 228/264; 228/19; 29/762; 310/333
[58] Field of Search ................ 228/264, 19; 29/762; 310/333

[56] References Cited

U.S. PATENT DOCUMENTS

| | | | |
|---|---|---|---|
| 5,164,037 | 11/1992 | Iwami et al. | 228/264 |
| 5,172,469 | 12/1992 | Onda et al. | 29/762 |
| 5,216,803 | 6/1993 | Nolan et al. | 228/264 |
| 5,326,014 | 7/1994 | Morita et al. | 228/110.1 |
| 5,662,766 | 9/1997 | Ishikawa et al. | 310/333 |

OTHER PUBLICATIONS

"Use of Ultrasonics for Integrated Circuit Chip Removal," *IBM Technical Disclosure Bulletin*, vol. 23, No. 3 Aug. 1980, p. 979.

"Ultrasonic Method to Remove Chips Mounted on Ceramic or of Other Materials Substrates," *Research Disclosure*, Aug. 1991, No. 328.

"Ultrasonic Chip Removal from Burn-In Substrates," *Research Disclosure*, May 1992, No. 337.

*Primary Examiner*—P. Asutin Bradley
*Assistant Examiner*—Jeffrey T. Knapp
*Attorney, Agent, or Firm*—Ira D. Blecker

[57] ABSTRACT

A device for removal of a semiconductor chip interconnected to a substrate package via solder ball connections, for instance, includes an ultrasonic transducer for providing lateral ultrasonic vibration. A converter is coupled between the ultrasonic transducer and semiconductor chip for converting the lateral ultrasonic vibration to a torsional ultrasonic vibration, wherein the torsional ultrasonic vibration is perpendicular to the lateral ultrasonic vibration. The lateral-to-torsional converter further applies the torsional ultrasonic vibration to the chip for facilitating its removal from the substrate package. A method for removal of a semiconductor chip interconnected to a substrate package is also disclosed.

20 Claims, 3 Drawing Sheets

ULTRASONIC CHIP REMOVAL METHOD AND APPARATUS

BACKGROUND OF THE INVENTION

1. Field of the Invention

This invention relates generally to a method and apparatus for removal of a semiconductor chip from a packaging substrate and, more particularly, to an ultrasonic method and apparatus for removal of the semiconductor chip from the packaging substrate.

2. Discussion of the Related Art

Semiconductor devices typically comprise one or more semiconductor chips designed for performing a desired function. The manufacture of semiconductor devices begins with the manufacture of the semiconductor chips. Semiconductor chips are first produced in a wafer form. The semiconductor chips are subsequently diced from the wafer into individual chips and then packaged. Individual chips, or multiple chips, may be packaged on a suitable substrate such as a multilayer ceramic (MLC), multichip module (MCM), or package, for instance.

Multichip module substrates are known in the art and thus only briefly described herein. In addition, a substrate may also be referred to as a package, wherein the terms are used interchangeably herein below. MCM substrates typically comprise a number of layers of ceramic material, including metalizations, internal wiring networks, vias, and bond pads. Each layer is first formed of an unfired ceramic material, then punched and patterned according to a desired semiconductor chip package design. The layers are then assembled and aligned together in a predetermined order. The unfired ceramic material is then fired and flattened, as necessary. The MCM substrate thus produced is used for making chip-to-package interconnection to the one or more semiconductor chips for which it was designed. Upon a positioning and attaching of the semiconductor chip onto the substrate, the chip can then be electrically connected thereto, as appropriate. Electrical interconnection between the MCM package and the semiconductor chip(s) can be made using wirebonding, flip-chip, thermally activated bonding, and/or other chip-to-package interconnect techniques known in the art. The substrate also includes input/output pins, or other suitable form of input/output connections, for interfacing the chip to a next level of packaging, for example, to a printed circuit board, or the like.

One example for electrical interconnection between a MCM package and the corresponding semiconductor chip(s) is Controlled Collapsed Chip Connector (C4) solder ball grid arrays. C4 solder ball connection techniques are increasingly being used for electronic component-to-package interconnections. Subsequent to interconnecting a chip to an MCM, occasionally, the chip and/or its chip-to-package interconnection may be found to be defective for one reason or another. In the instance of a defective chip and/or chip-to-package interconnection, the MCM is subjected to a rework process. During the rework process, the chip is removed from the MCM substrate.

One conventional technique for removing C4 mounted chips from a substrate is to apply heat in order to melt or reflow the solder balls. Two problems with the heating technique of removing a chip from a substrate is that there is a limit on the number of times the solder balls can be reflowed. Furthermore, if there are a plurality of chips on the substrates, the application of heat generally reflows the solder balls on all of the chip sites. Still further, substrates are generally bulky and thus require a heating process time on the order of thirty minutes or longer. In addition, tooling for rendering such a hot process removal is very expensive, effectively costing on the order of 100–200 thousand dollars or more. Yet still further, applying localized heat is ineffective for C4 counts or connections above a few hundred.

In addition to the heating removal technique, other known forms of selective chip removal from an MCM substrate include the use of ultrasonic energy to vibrate the chips. A conventional ultrasonic transducer is used, the transducer being tuned to the particular frequency which causes the chip to resonate, thereby breaking away from the solder balls. The transducer is tuned such that the resonating chip exceeds the amount of energy required to break the chip away from the solder balls. Such a known ultrasonic removal process further includes the use of lateral ultrasonic vibration applied to the chip being removed from the MCM. An ultrasonic transducer, which includes a piezoelectric crystal, provides the ultrasonic vibration. It is noted, however, that piezoelectric crystals only generate one dimensional lateral vibration. Such lateral ultrasonic vibration has been found to be generally suitable for removing small chips on the order of 15.0 mm square of a certain thickness, and further having less than 2,000 C4 solder ball connections. However, such a lateral ultrasonic vibration method is limited and furthermore found to be unacceptable for use with advanced semiconductor chips which have an increased input/output (I/O) density (corresponding to an increased number of C4 solder ball connections greater than 2,000), larger size (i.e., having an x-y size greater than 15.0 mm), and furthermore being thinner (i.e., in the z-dimension). In the latter instance, problems which have been encountered include cracking of the chip being removed and/or an undesirable popping off or damaging of neighboring components on the MCM.

SUMMARY OF THE INVENTION

It is an object of the present invention to provide an apparatus for the removal of a semiconductor chip interconnected with a substrate with an aim to overcome the aforementioned problems and disadvantages.

In accordance with the present invention, an apparatus for removal of a semiconductor chip interconnected to a substrate package includes an ultrasonic transducer for providing lateral ultrasonic vibration. A converter means is coupled between the ultrasonic transducer and semiconductor chip for converting the lateral ultrasonic vibration to a torsional ultrasonic vibration, wherein the torsional ultrasonic vibration is perpendicular to the lateral ultrasonic vibration. The lateral-to-torsional converter means is further for applying the torsional ultrasonic vibration to the chip for facilitating its removal from the substrate package.

In further accordance with the present invention, the lateral-to-torsional converter means includes an elongated member having a central axis disposed in a direction of the lateral vibration. The elongated member includes a first portion, a second portion, and a third portion. The first portion is adapted for connection with the transducer. The second portion includes a beam having a length dimension, a width dimension and a depth dimension. The beam is disposed intermediate the first portion and the third portion along its length dimension at an angle with respect to a line perpendicular to the central axis. The beam further is oriented in a twisted fashion from top to bottom along its depth dimension. Lastly, the third portion is adapted for connection with the semiconductor chip.

BRIEF DESCRIPTION OF THE DRAWINGS

The foregoing and other teachings and advantages of the present invention will become more apparent upon a

Figure 1:
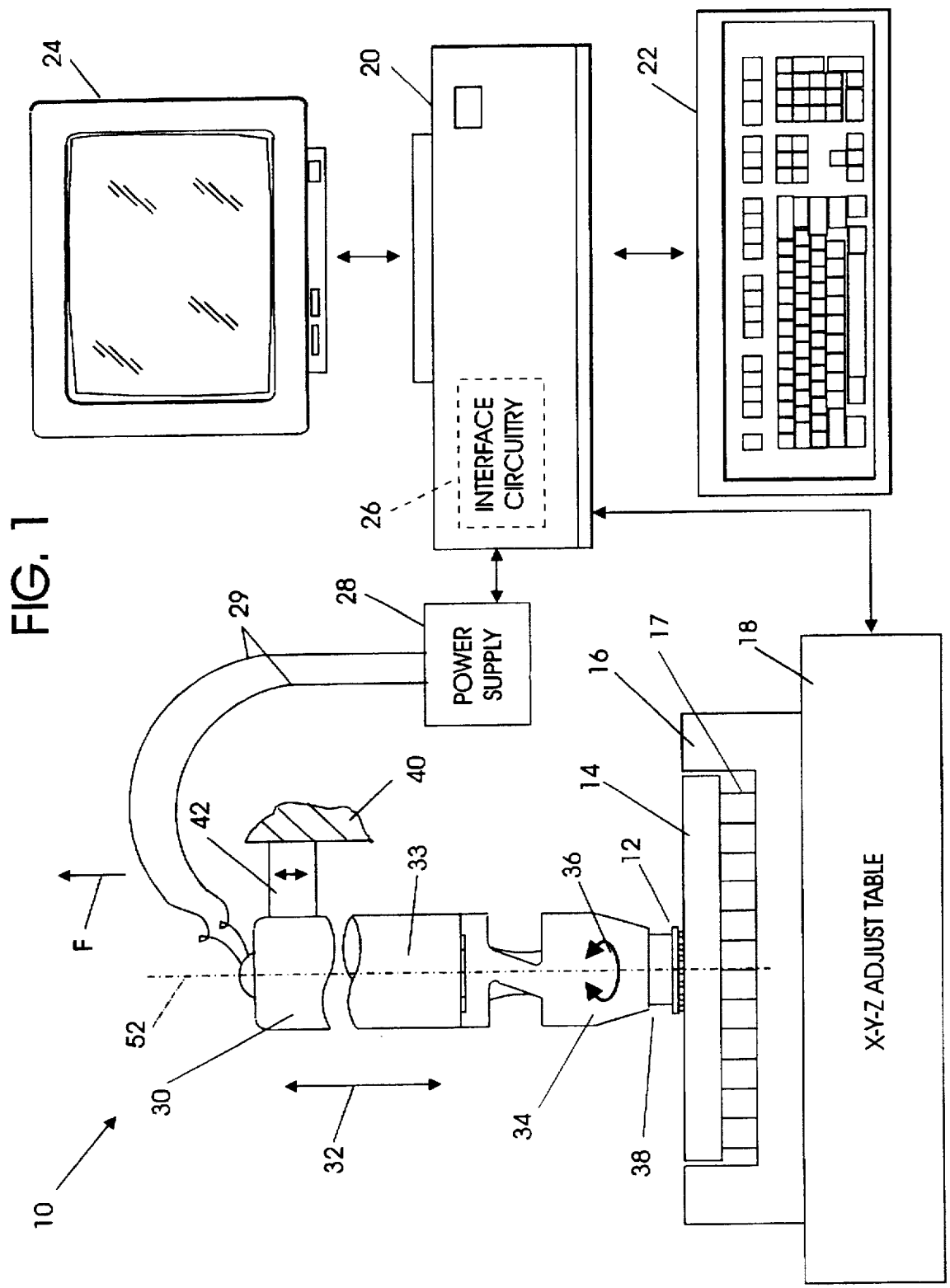
Figure 2:
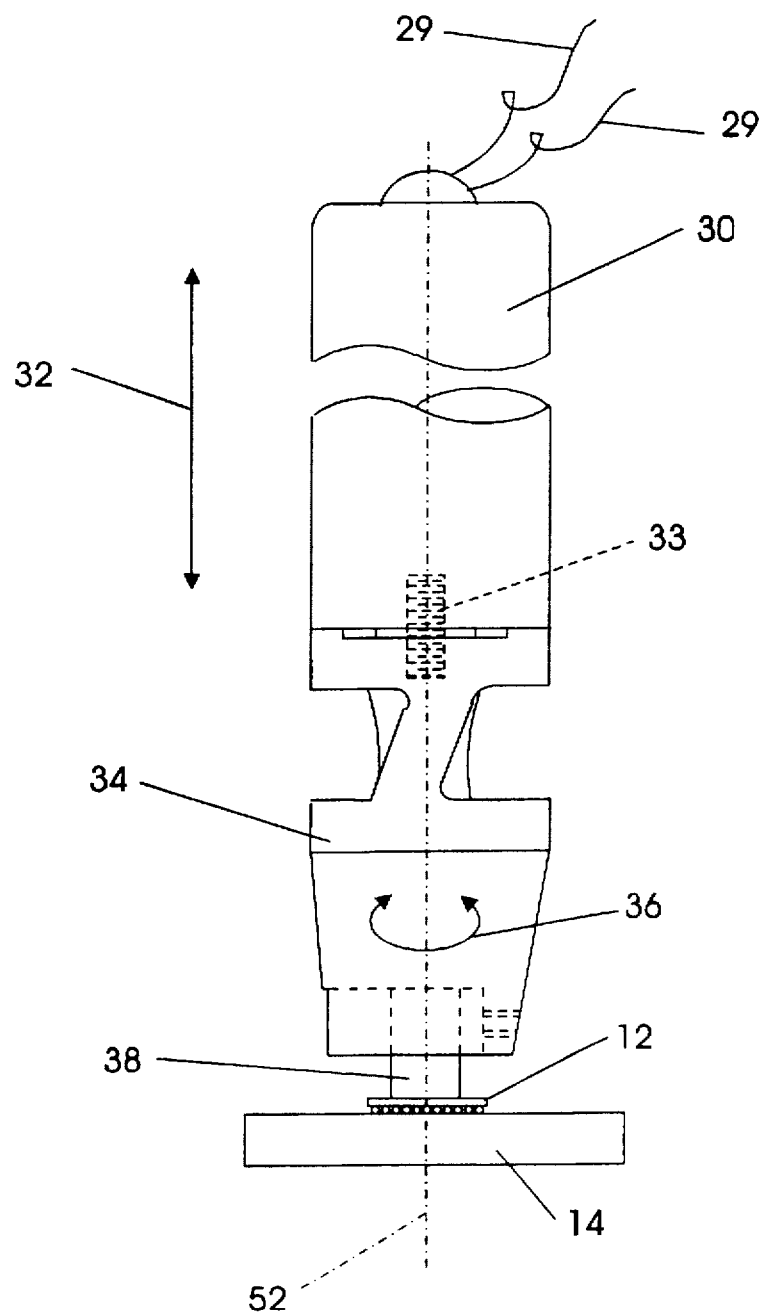
Figure 3A:
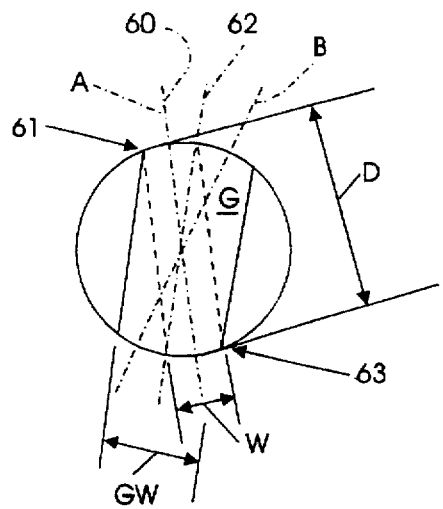
Figure 3B:
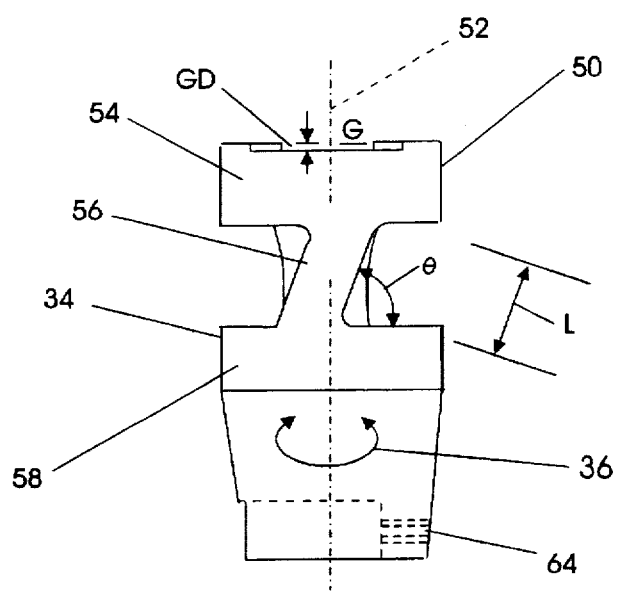
Figure 3C:
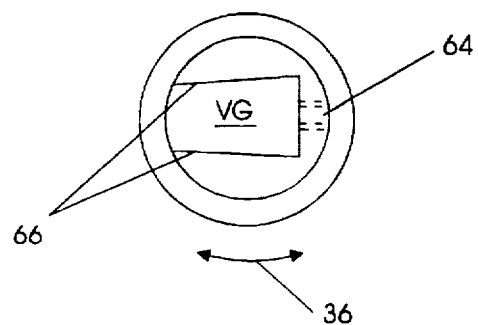

3 detailed description of the best mode for carrying out the invention as rendered below. In the description to follow, reference will be made to the accompanying drawings, where like reference numerals are used to identify like parts in the various views and in which:

FIG. 1 is illustrative of a system block diagram of an ultrasonic chip removal apparatus according to the present invention;

FIG. 2 shows the ultrasonic chip removal apparatus according to the present invention; and FIGS. 3A–3C illustrate various views of the lateral-to-torsional converter of the ultrasonic chip removal apparatus according to the present invention.

DETAILED DESCRIPTION OF A PREFERRED EMBODIMENT OF THE INVENTION

Turning now to FIG. 1, a torsional ultrasonic apparatus 10 is used for removal of a semiconductor chip 12 from a substrate package 14. As discussed above, the semiconductor chip 12 is interconnected with substrate package 14 via connections, such as solder ball connections or the like. Apparatus 10 includes a substrate holder 16 suitable for securably holding substrate package 14 during a chip removal process. As shown, substrate package 14 is oriented within the substrate holder 16, chip side up and input/output I/O pin 17 side down.

An x-y-z adjustable table 18 (or stage) supports the substrate holder 16 for movement of the substrate holder through a variety of x,y,z positions, as appropriate during a chip removal process. For instance, adjustable table 18 can be used to position substrate holder 16 between a load substrate position and a chip removal position. Adjustable table 18 may further be used for positioning of the substrate 14 for implementing a successive removal of more than one chip (not shown) on substrate 14, as may be required for a removal of more than one chip from substrate 14.

A controller 20, such as a computer, is used for controlling an operation of the torsional ultrasonic apparatus 10 during the chip removal process. Controller 20 can include any suitable controller or computer, or the like. Controller 20 includes an input device 22 (such as, a keyboard or the like), an output device 24 (such as a display or the like), and appropriate interface circuitry 26 suitable for interfacing the controller 20 with controllable component parts. One such component part includes the x-y-z adjustable table 18. Another controllable component part includes a programmable power supply 28, for outputting a desired power output and duration thereof, to be discussed further herein below. Controller 20 is programmed via known programming techniques for controlling apparatus 10 and its controllable component parts as appropriate for carrying out the chip removal process and/or other alternate processes, to be discussed further herein below.

Apparatus 10 further includes an ultrasonic transducer 30. Ultrasonic transducer 30 includes any suitable ultrasonic transducer which provides a lateral ultrasonic vibration, when energized, in the lateral direction as indicated by arrow 32 of FIGS. 1 and 2. Such an ultrasonic transducer is commercially available, for example, from Branson Ultrasonics of Danbury, Conn. For purposes of this description, the term "lateral" is used in a relative sense to represent a back and forth ultrasonic vibration direction of the transducer, wherein transducer 30, as shown, is oriented vertically. The ultrasonic vibration of transducer 30 may likewise be described as a vertically oriented transverse ultrasonic vibration. Ultrasonic transducer 30 is electrically connected to power supply 28 via suitable electrical conductors 29. The top portion of ultrasonic transducer 30 includes a piezoelectric crystal which shrinks upon an application of electrical power (i.e., Power ON) and relaxes when power is shut-off (i.e., power OFF), as is typical of an ultrasonic transducer.

A lateral-to-torsional converter means 34 is disposed between the ultrasonic transducer 30 and semiconductor chip 12 as shown in FIGS. 1 and 2. Lateral-to-torsional converter 34 is connected to ultrasonic transducer 30, via suitable connection, such as by suitable threaded stock 33 and corresponding threaded holes in each of the converter 34 and transducer 30, further having the capability to withstand ultrasonic vibration. Lateral-to-torsional converter 34 is further connected to semiconductor chip 12 via stud element 38. Stud element 38 is affixed to a top surface of chip 12 using any suitable adhesive or the like, wherein the adhesive is disposed between the contact interface of the stud element 18 and chip 12. Lateral-to-torsional converter 34 is for converting the lateral ultrasonic vibration to a torsional ultrasonic vibration, wherein the torsional vibration is perpendicular to the lateral ultrasonic vibration. Torsional vibration is shown in FIG. 1 by the arrow 36. Lateral-to-torsional converter 34 applies a torsional ultrasonic vibration to the semiconductor chip 12 for facilitating its removal from the substrate package 16. An amount of torsional ultrasonic vibration applied to the chip 12 can be applied in a controlled manner, for instance, as controlled by controller 20 and power supply 28. An amount of torsional ultrasonic vibration applied to the chip 12 is also determined in part by the particular design of the lateral-to-torsional converter 34, as will be discussed further herein below.

Turning once again to FIG. 1, ultrasonic transducer 30 and lateral-to-torsional converter 34 are disposed in a vertical orientation above semiconductor chip 12 using any suitable means for supporting the same in such a vertical orientation. For instance, ultrasonic transducer 30 can be attached to a vertical ground surface 40 via suitable means, such as a lateral slide mechanism 42. Slide mechanism 42 can comprise a manually controlled or computer controllable slide mechanism. For instance, a computer controllable slide mechanism 42 can used for exerting a prescribed controlled amount of upward tensioning force F upon ultrasonic transducer 30 and lateral-to-torsional converter 34 during a chip removal process, as appropriate. In the later instance, a similar tensioning force is thus exerted between the chip 12 and substrate 14. Alternatively, lateral slide mechanism 42 may be held stationary, while x-y-z adjustable table 18 is controlled for a movement in the downward direction, thereby causing a tensioning force to be exerted between chip 12 and substrate 14.

Referring now to FIGS. 3A–C, the lateral-to-torsional converter 34 shall be described in further detail. Lateral-to-torsional converter 34 includes an elongated member 50 of a generally circular cross-section and having a central axis 52 disposed in a direction of the lateral vibration 32. The elongated member 50 includes a first portion 54, a second portion 56, and a third portion 58. The first portion 54 is adapted for connection with ultrasonic transducer 30. The third portion 58 is adapted for connection with the semiconductor chip, to be discussed further below.

The second portion 56 includes a beam having a length dimension L, a width dimension W and a depth dimension D. The beam is disposed intermediate the first portion 54 and the third portion 58 along its length dimension L at an angle θ with respect to a line perpendicular to the central axis 52. The angle θ is approximately on the order of less than 90 degrees. For instance, in a first embodiment, angle θ is selected to be approximately 87 degrees. The angle θ is selected, in part, in accordance with a desired amplitude of the converted lateral-to-torsional ultrasonic vibration to be obtained. The smaller the angle θ the greater the amplitude of the converted ultrasonic vibration. The beam is further oriented in a twisted fashion from top to bottom along its depth dimension D. That is, the beam is twisted in such a manner so as to have a centerline 60 (FIG. 3A) along its depth dimension D disposed at a first angular position A about the central axis 52 at the top of the beam and disposed at a second angular position B at the bottom of the beam.

Referring to FIGS. 3A and 3B, the first portion 54 of the lateral-to-torsional converter 34 further includes a groove G in a top surface thereof. The groove G includes a centerline 62 offset from the centerline 60 of the top of the beam along the beam's depth dimension D. The groove G further includes a width dimension GW larger than the width dimension W of the beam. Preferably, to provide a most effective transfer of vibration from lateral to torsional, the center lines (60, 62) and widths of beam 56 and grove G are selected, such that, as viewed from the top (FIG. 3A), an upper left-hand corner of groove G is aligned with an upper left-hand corner of beam 56 as indicated by numeral 61. In addition, a lower right-hand corner of groove G is aligned with a lower right-hand corner of beam 56 as indicated by numeral 63.

Referring to FIG. 3B, groove G is further of a depth GD sufficient to facilitate and promote the lateral-to-torsional vibration of torsional converter 50. For example, the depth GD of groove G is, at a minimum, on the order of greater than 0.01 inches. Other nominal depths may likewise be on the order 0.05 to 0.1 inches, in part, according to the desired lateral-to-torsional conversion for a particular application of the torsional converter 50.

As indicated above, the third portion 58 is adapted for connection with the semiconductor chip. In particular, referring now to FIGS. 3B and 3C, the third portion 58 further includes a generally elongated conical shape oriented in a direction along the central axis 52. The elongated conical shape extends from a first larger cross-sectional dimension at the top thereof to a second smaller cross-sectional dimension at the bottom thereof. Further, the stud element 38 (FIG. 1 and 2) is removably attached to the lower end of the conically shaped third portion 58, via any suitable form of removable attachment. For instance, to facilitate one form of removable attachment, a V-shaped groove VG is disposed in the bottom end of the conically shaped third portion 58 for receiving a top portion of the stud element 38 therein. A set screw 64 is used for disposing the top portion of the stud element against side surfaces 66 of the V-shaped groove VG, thereby removably attaching the stud element to the lateral-to-torsional converter 34.

In a preferred embodiment, lateral-to-torsional converter 34 is a unitary element of a material having a modulus of vibration conducive of ultrasonic vibration. That is, the material should have good acoustic properties for transferring of vibrational energy, in contract to absorbing energy. The material of the lateral-to-torsional converter 34 preferably includes metal, for example, aluminum, titanium, and/or steel. Formation of the lateral-to-torsional converter 34 can be accomplished by suitable machining techniques known in the art, such as machining, hot forming, or electrical discharge machining. Converter 34 may likewise comprise separate pieces with respective portions suitably joined together.

Referring once again to FIG. 1, the method and operation of the present invention for removal of an electronic component, such as a semiconductor chip 12, interconnected to a substrate, such as substrate package 14, via solder ball connections 13 shall now be described. The method includes the steps of affixing a stud element to a top portion of the semiconductor chip desired to be removed. The semiconductor chip is coupled to the lateral-to-torsional ultrasonic vibration converter via the stud element, wherein the stud element is removably attached to the lateral-to-torsional converter. One manner of attaching the stud element to the lateral-to-torsional converter is to control the positioning of the x-y-z adjustable table in conjunction with the controllable slide mechanism 42 for bringing the lateral-to-torsional converter 34 and stud element 38 into an initial spatial relationship in preparation for attaching the stud element to the lateral-to-torsional converter. Once the initial positioning is accomplished, the set screw 64 may be tightened.

For purposes of removing the semiconductor chip from the substrate, controller 20 is suitably programmed for controlling associated component parts to perform the various steps hereof. For instance, controller 20 may be used for controlling an amount of power applied to the ultrasonic transducer 30, and thus an amount of lateral ultrasonic vibration generated thereby. Upon an energization of the ultrasonic transducer 30 by power supply 28, the transducer 30 provides lateral (or transverse) ultrasonic vibration, wherein the transducer is vertically oriented. Power supply 28 can be operated to provide various ON/OFF duty cycles (e.g., 0.1 sec ON and 0.2 sec OFF) as may be required for a particular ultrasonic vibration application. The lateral-to-torsional ultrasonic vibration converter 34 converts the lateral ultrasonic vibration to a torsional ultrasonic vibration, wherein the torsional ultrasonic vibration is preferably perpendicular to the lateral ultrasonic vibration. The torsional ultrasonic vibration is then applied to the chip 12 via the stud element 38 for facilitating its removal from the substrate package 14. The cyclical torsional ultrasonic vibration is applied for an amount of time necessary for separation to occur. With an appropriate power level, the chip can be removed in less than one second. In a test conducted with the present invention, a large chip on the order of 18 mm×18 mm with a C4 count of approximately several thousand C4 connections was removed without any cracking and no neighboring components were popped off or damaged. The present invention thus provides a quick and simple process for electronic component rework.

The amplitude of the torsional ultrasonic vibration applied to the chip is controlled, in part, by the power supplied to transducer 30 and further, in part, by the efficiency of the lateral-to-torsional converter 34. As previously indicated, the amplitude of torsional ultrasonic vibration can be increased by decreasing the angle θ of the beam of the second portion of the lateral-to-torsional converter. In addition, a tensioning force may be applied between the chip 12 and the substrate 14 during torque cycling of the chip to further assist in the removal of the chip from the substrate using the method and apparatus of the present invention.

The method of the present invention provides for removal of a component part from a package, wherein the component part is interconnected to the package. The method of the present invention includes the steps of securing the package, providing an ultrasonic transducer for generating lateral ultrasonic vibration, converting the lateral ultrasonic vibration to a torsional ultrasonic vibration, and applying the torsional ultrasonic vibration to the component part. The torsional ultrasonic vibration is applied for an amount of time sufficient to break the bond between the component part and package from the package. The torsional ultrasonic vibration is applied in a manner which minimizes damage to the component part and any neighboring component parts on the package.

In addition to utilization of the present invention for removal of a semiconductor chip from a substrate, as discussed herein above, the present invention may also be used for performing quick reliability evaluation, such as mini-cycle evaluations. Because the present invention provides torsional vibration, a relative displacement between a chip and substrate corresponding to a distance from a neutral point (DNP) can be optimally determined. That is, a DNP may be optimized for use with real life parts. This will effectively reduce a stressing time by a few orders of magnitude, wherein the stressing time can be accomplished in a few seconds to a few minutes.

The present invention may further be used for solder alloy fatigue property screening. That is, different solder alloys can be used to connect chips to substrates or connect modules to cards. The present method and apparatus can be advantageously used to perform stress tests to select a best solder allow for a particular application, in terms of fatigue resistance.

There has thus been shown a torsional ultrasonic method and apparatus which provides rapid and economical removal of semiconductor chips interconnected using solder balls from a substrate package. Such a method and apparatus are further highly effective for cycled torque removal of semiconductor chips interconnected to a substrate package, especially for large chips having many C4 joints, corresponding to C4 counts beyond 2,000, for instance.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, other forms of torque cycling may be utilized using the ultrasonic vibration apparatus and method of the present invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method for removal of a semiconductor chip interconnected to a substrate package via solder ball connections, said method comprising the steps of:

providing lateral ultrasonic vibration with the use of an ultrasonic transducer; and converting the lateral ultrasonic vibration to a torsional ultrasonic vibration with the use of a lateral-to-torsional ultrasonic vibration converter, the torsional ultrasonic vibration being perpendicular to the lateral ultrasonic vibration; and applying the torsional ultrasonic vibration to the chip for facilitating its removal from the substrate package, wherein the semiconductor chip is coupled to the lateral-to-torsional ultrasonic vibration converter.

2. The method of claim 1, wherein the semiconductor chip is coupled to the lateral-to-torsional converter via a stud element, the stud element being removably attached to the lateral-to-torsional converter and further wherein the stud element is affixed to a top portion of the semiconductor chip.

3. The method of claim 1, further comprising
applying a tensioning force between the chip and the substrate.

4. Apparatus for ultrasonic torsional cycling of a component part interconnected to a substrate package, said apparatus comprising:

means for securing the substrate package;

an ultrasonic transducer;

power supply for controllably energizing said ultrasonic transducer, wherein upon an energization, said ultrasonic transducer provides lateral ultrasonic vibration;

means coupled between said ultrasonic transducer and the component part for converting the lateral ultrasonic vibration to a torsional ultrasonic vibration, said lateral-to-torsional converter means further for applying torsional ultrasonic vibration to the component part perpendicular to the lateral ultrasonic vibration; and means for controlling said power supply to energize said ultrasonic transducer, wherein the torsional ultrasonic vibration facilitates a desired torsional cycling of the component part on the substrate package.

5. The apparatus of claim 4, wherein said control means controls said power supply in a manner for ultrasonic torsional cycling of the component part to facilitate its release from the substrate package.

6. The apparatus of claim 4, wherein said lateral-to-torsional converter means includes an elongated member having a central axis disposed in a direction of the lateral vibration, the elongated member having a first portion, a second portion, and a third portion, wherein the first portion is adapted for connection with said transducer, the second portion including a beam having a length dimension, a width dimension and a depth dimension, the beam disposed intermediate the first portion and the third portion along its length dimension at an angle with respect to a line perpendicular to the central axis, the beam further being oriented in a twisted fashion from top to bottom along its depth dimension, and the third portion is adapted for connection with the component part.

7. The apparatus of claim 6, further comprising
means for applying a tensioning force between the component part and the substrate package.

8. The apparatus of claim 6, further wherein
the first portion of said lateral-to-torsional converter means includes a groove in a top thereof, the groove having a centerline offset from a centerline of the top of the beam along the beam's depth dimension, the groove further having a width dimension larger than the width dimension of the beam, and the third portion further includes a generally elongated conical shape oriented in a direction along the central axis, from a first larger cross-sectional dimension to a second smaller cross-sectional dimension.

9. The apparatus of claim 8, wherein said lateral-to-torsional converter means is coupled to the component part via a stud element, the stud element being removably attached to an end of the conically shaped third portion and further wherein the stud element is affixed to a top portion of the component part.

10. The apparatus of claim 6, further wherein
said lateral-to-torsional converter means is a unitary element of a material having a modulus of vibration conducive of ultrasonic vibration.

11. The apparatus of claim 10, further wherein the material of said lateral-to-torsional converter means includes a metal selected from the group consisting of aluminum, titanium, and steel.

12. Apparatus for removal of a semiconductor chip interconnected to a substrate package, said apparatus comprising:

an ultrasonic transducer for providing lateral ultrasonic vibration; and means coupled between said ultrasonic transducer and the semiconductor chip for converting the lateral ultrasonic vibration to a torsional ultrasonic vibration, the torsional ultrasonic vibration being perpendicular to the lateral ultrasonic vibration, said lateral-to-torsional converter means further for applying the torsional ultrasonic vibration to the chip for facilitating its removal from the substrate package.

13. The apparatus of claim 12, wherein the semiconductor chip is coupled to said lateral-to-torsional converter means via a stud element, the stud element being removably attached to said lateral-to-torsional converter means and further wherein the stud element is affixed to a top portion of the semiconductor chip.

14. The apparatus of claim 12, further comprising means for applying a tensioning force between the chip and the substrate, said tensioning force means coupled to said ultrasonic transducer.

15. The apparatus of claim 12, wherein said lateral-to-torsional converter means includes an elongated member having a central axis disposed in a direction of the lateral vibration, the elongated member having a first portion, a second portion, and a third portion, wherein the first portion is adapted for connection with said transducer, the second portion including a beam having a length dimension, a width dimension and a depth dimension, the beam disposed intermediate the first portion and the third portion along its length dimension at an angle with respect to a line perpendicular to the central axis, the beam further being oriented in a twisted fashion from top to bottom along its depth dimension, and the third portion is adapted for connection with the semiconductor chip.

16. The apparatus of claim 15, further comprising means for applying a tensioning force between the chip and the substrate.

17. The apparatus of claim 15, further wherein the first portion of said lateral-to-torsional converter means includes a groove in a top thereof, the groove having a centerline offset from a centerline of the top of the beam along the beam's depth dimension, the groove further having a width dimension larger than the width dimension of the beam, and the third portion further includes a generally elongated conical shape oriented in a direction along the central axis, from a first larger cross-sectional dimension to a second smaller cross-sectional dimension.

18. The apparatus of claim 17, wherein said lateral-to-torsional converter means is coupled to the semiconductor chip via a stud element, the stud element being removably attached to an end of the conically shaped third portion and further wherein the stud element is affixed to a top portion of the semiconductor chip.

19. The apparatus of claim 15, further wherein said lateral-to-torsional converter means is a unitary element of a material having a modulus of vibration conducive of ultrasonic vibration.

20. The apparatus of claim 19, further wherein the material of said lateral-to-torsional converter means includes a metal selected from the group consisting of aluminum, titanium, and steel.

* * * * *